United States Patent
Yoo et al.

(10) Patent No.: US 6,834,014 B2
(45) Date of Patent: Dec. 21, 2004

(54) SEMICONDUCTOR MEMORY SYSTEMS, METHODS, AND DEVICES FOR CONTROLLING ACTIVE TERMINATION

(75) Inventors: Chang-sik Yoo, Suwon (KR); Kye-hyun Kyung, Suwon (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 298 days.

(21) Appl. No.: 10/199,857

(22) Filed: Jul. 19, 2002

(65) Prior Publication Data

US 2003/0016550 A1 Jan. 23, 2003

(30) Foreign Application Priority Data

Jul. 20, 2001 (KR) .......................................... 2001-43789

(51) Int. Cl.$^7$ .............................................. G11C 16/04
(52) U.S. Cl. .................................. 365/189.01; 365/148
(58) Field of Search ............................ 365/189.01, 148

(56) References Cited

U.S. PATENT DOCUMENTS

| | | | | |
|---|---|---|---|---|
| 6,151,648 A | * | 11/2000 | Haq | 710/107 |
| 6,157,688 A | * | 12/2000 | Tamura et al. | 375/348 |
| 6,356,106 B1 | * | 3/2002 | Greeff et al. | 326/30 |
| 6,493,394 B2 | * | 12/2002 | Tamura et al. | 375/257 |
| 6,502,212 B1 | * | 12/2002 | Coyle et al. | 714/43 |
| 6,519,173 B2 | * | 2/2003 | Funaba et al. | 365/63 |

* cited by examiner

*Primary Examiner*—Michael S. Lebentriti
*Assistant Examiner*—Tuan T. Nguyen
(74) *Attorney, Agent, or Firm*—Myers Bigel Sibley & Sajovec

(57) ABSTRACT

An integrated circuit memory device for use in a memory system receives predetermined command/address signals from a memory controller and reads and writes data in response to the command/address signals. The memory device includes at least one input/output terminal that inputs/outputs data from/to the memory controller via a data input/output bus, at least one termination resistor, and an active termination control signal generator that generates a control signal to control active termination of the at least one data input/output terminal in response to a chip selection signal from the memory controller. The memory device also includes at least one switch coupled in series with the at least one termination resistor between the at least one input/output terminal and a predetermined voltage wherein the at least one switch is switched on/off in response to the control signal such that the at least one input/output terminal is connected/disconnected to/from the predetermined voltage responsive to the control signal and such that the at least one termination resistor is coupled in series between the predetermined voltage and the at least one input/output terminal when the at least one switch is switched on and such that the at least one input/output terminal is decoupled from the predetermined voltage when the at least one switch is switched off. Related memory systems and methods are also discussed.

28 Claims, 13 Drawing Sheets

FIG. 3
(PRIOR ART)

| | TERMINATION RESISTOR ON/OFF CONTROL SIGNAL |
|---|---|
| DRAM TERMINAL | 1 |
| MODULE CONNECTOR | 1 |
| CONTROLLER TERMINAL | 2 |

FIG. 6

| | INTERNAL TERMINATION RESISTOR ON/OFF CONTROL SIGNAL |
|---|---|
| DRAM TERMINAL | +1 |
| MODULE CONNECTOR | 0 |
| CONTROLLER TERMINAL | 0 |

FIG. 7

| CONFIGURATION | OPERATION TO | DQ BUS ACTIVE TERMINATION MODE/TERMINATION RESISTOR ||||||||
| | | CONTROLLER || MEMORY (DRAM) ||||||
| | | | | MODULE 1 || MODULE 2 ||
| | | READ | WRITE | F_RANK | B_RANK | F_RANK | B_RANK |
|---|---|---|---|---|---|---|---|
| 2-RANK/2-RANK | MODULE 1 | ON (2*RT) | OFF | OFF | OFF | ON (2*RT) | ON (2*RT) |
| | MODULE 2 | ON (2*RT) | OFF | ON (2*RT) | ON (2*RT) | OFF | OFF |
| 2-RANK/1-RANK | MODULE 1 | ON (2*RT) | OFF | OFF | OFF | ON (RT) | x |
| | MODULE 2 | ON (2*RT) | OFF | ON (2*RT) | ON (2*RT) | OFF | x |
| 1-RANK/2-RANK | MODULE 1 | ON (2*RT) | OFF | OFF | x | ON (2*RT) | ON (2*RT) |
| | MODULE 2 | ON (2*RT) | OFF | ON (RT) | x | OFF | OFF |
| 1-RANK/1-RANK | MODULE 1 | ON (RT) | OFF | OFF | x | ON (RT) | x |
| | MODULE 2 | ON (RT) | OFF | ON (RT) | x | OFF | x |
| 1-RANK/EMPTY | MODULE 1 | ON (RT) | OFF | x | x | x | x |
| EMPTY/1-RANK | MODULE 2 | ON (RT) | OFF | ON (2*RT) | x | ON (RT) | x |
| 2-RANK/EMPTY | MODULE 1 | ON (RT) | OFF | x | x | x | x |
| EMPTY/2-RANK | MODULE 2 | ON (RT) | OFF | x | x | ON (2*RT) | ON (2*RT) |

SEMICONDUCTOR MEMORY SYSTEMS, METHODS, AND DEVICES FOR CONTROLLING ACTIVE TERMINATION

RELATED APPLICATIONS

This application claims the benefit of Korean Patent Application No. 2001-43789, filed Jul. 20, 2001, the disclosure of which is hereby incorporated herein by reference in its entirety as if set forth fully herein.

BACKGROUND OF THE INVENTION

1. Field of the Invention

The present invention relates to semiconductor memory systems, and more particularly, to semiconductor memory systems, methods and devices including active termination.

2. Description of the Related Art

Semiconductor memory devices have been widely employed in computer systems such as personal computers or servers. In order to provide higher performance and larger storage capacities in such semiconductor memory devices, memory modules may each include a plurality of semiconductor memory devices, and a plurality of memory modules may be installed in a computer system. A conventional semiconductor memory system may employ a structure where a plurality of memory modules are interconnected in a stub configuration. In a semiconductor memory system having such a stub configuration, a stub series terminated logic (SSTL) standard (in which series resistors are additionally applied to each stub bus structure) may generally be applied when performing bus termination.

FIG. 1 is a circuit diagram of a conventional semiconductor memory system adopting the SSTL standard. Referring to FIG. 1, a conventional semiconductor memory system may include data buses 100, 102, and 104, each of the data buses 100, 102, and 104 having two ends. One end of data buses 100 and 104 is connected to a termination voltage VTERM through a respective termination resistor RTERM. Memory modules 110 and 120 are arranged between data buses 100 and 102, and data buses 102 and 104, respectively, in a stub configuration. In the memory modules 110 and 170, a series resistor RSTUB is connected to a memory chip, for example, a dynamic random access memory (DRAM) 114 via a data bus 112.

The structure shown in FIG. 1 is usually used in double data rate (DDR) DRAMs. A memory system having such a configuration may normally operate at a data rate of about 300 Mbps. However, if the data rate continues to increase, a density of signals may become affected by a stub load. It may thus become difficult to use the memory system of FIG. 1 at a data rate greater than 500 Mbps. The series resistor RSTUB is introduced to reduce an effect of stub load but may have a limit in improving the performance of the memory system. One way to address this problem may be by using on-chip active termination. In other words, active termination indicates a method wherein termination resistors may be installed in a memory module and a memory controller chip set and wherein the termination resistors are coupled and decoupled as needed. Here, operations of coupling and decoupling the termination resistors can be changed according to the configuration of a memory system and command signals input into the memory system. For example, in the case of controlling termination by changing the configuration of a memory system, termination can be controlled by a memory controller using mode resister settings. On the other hand, when controlling termination with the use of a command signal, it should be determined first which rank of a memory module the command signal input (from the outside the memory module) is applied to. DRAMs in a rank may be unable to determine whether the command signal currently input into a memory system is applied to the rank to which they belong or to other ranks. Accordingly, more terminals for additional control signals may be installed at a memory controller chip set, a memory module connector, and DRAMs (for example, ranks) in each memory module.

SUMMARY OF THE INVENTION

According to embodiments of the present invention, an integrated circuit memory device can be provided for use in a memory system that receives predetermined command/address signals from a memory controller and that reads and writes data in response to the command/address signals. The memory device can include at least one input/output terminal that inputs/outputs data from/to the memory controller via a data input/output bus, at least one termination resistor, and an active termination control signal generator that generates a control signal to control active termination of the at least one data input/output terminal in response to a chip selection signal from the memory controller. At least one switch can be coupled in series with the at least one termination resistor between the at least one input/output terminal and a predetermined voltage. More particularly the at least one switch is switched on/off in response to the control signal such that the at least one input/output terminal is connected/disconnected to/from the predetermined voltage responsive to the control signal and such that the at least one termination resistor is coupled in series between the predetermined voltage and the at least one input/output terminal when the at least one switch is switched on and such that the at least one input/output terminal is decoupled from the predetermined voltage when the at least one switch is switched off.

According to additional embodiments of the present invention, methods can be provided for operating an integrated circuit memory device for use in a memory system that receives predetermined command/address signals from a memory controller and that reads and writes data in response to the command/address signals wherein the integrated circuit memory device comprises at least one input/output terminal that inputs/outputs date from/to the memory controller via a data input/output bus and at least one termination resistor. These methods can include generating a control signal to control active termination of the at least one data input/output terminal in response to a chip selection signal from the memory controller. Responsive to the control signal, the at least one termination resistor can be coupled in series between a predetermined voltage and the at least one input/output terminal, and the at least one termination resistor can be decoupled from between the predetermined voltage and the at least one input/output terminal.

BRIEF DESCRIPTION OF THE DRAWING

FIG. 3 is a table showing an increase in a number of terminals in accordance with active termination in the semiconductor memory system shown in FIG. 2;

FIG. 6 is a table showing an increase in a number of terminals in accordance with active termination in embodiments of semiconductor memory systems according to the present invention shown in FIG. 4;

FIG. 7 is a table showing active termination of a data input/output bus in accordance with configurations of semiconductor memory systems and command signals according to embodiments of the present invention;

DETAILED DESCRIPTION OF THE INVENTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
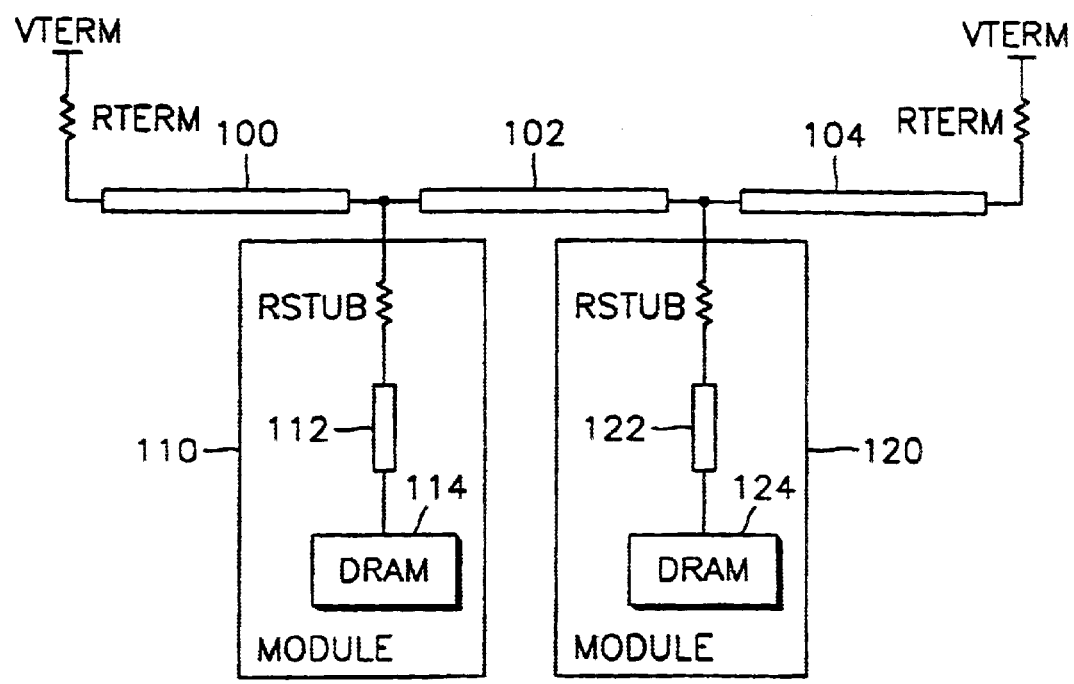
FIG. 1 is a circuit diagram of a conventional semiconductor memory device adopting the SSTL standard.
Figure 2:
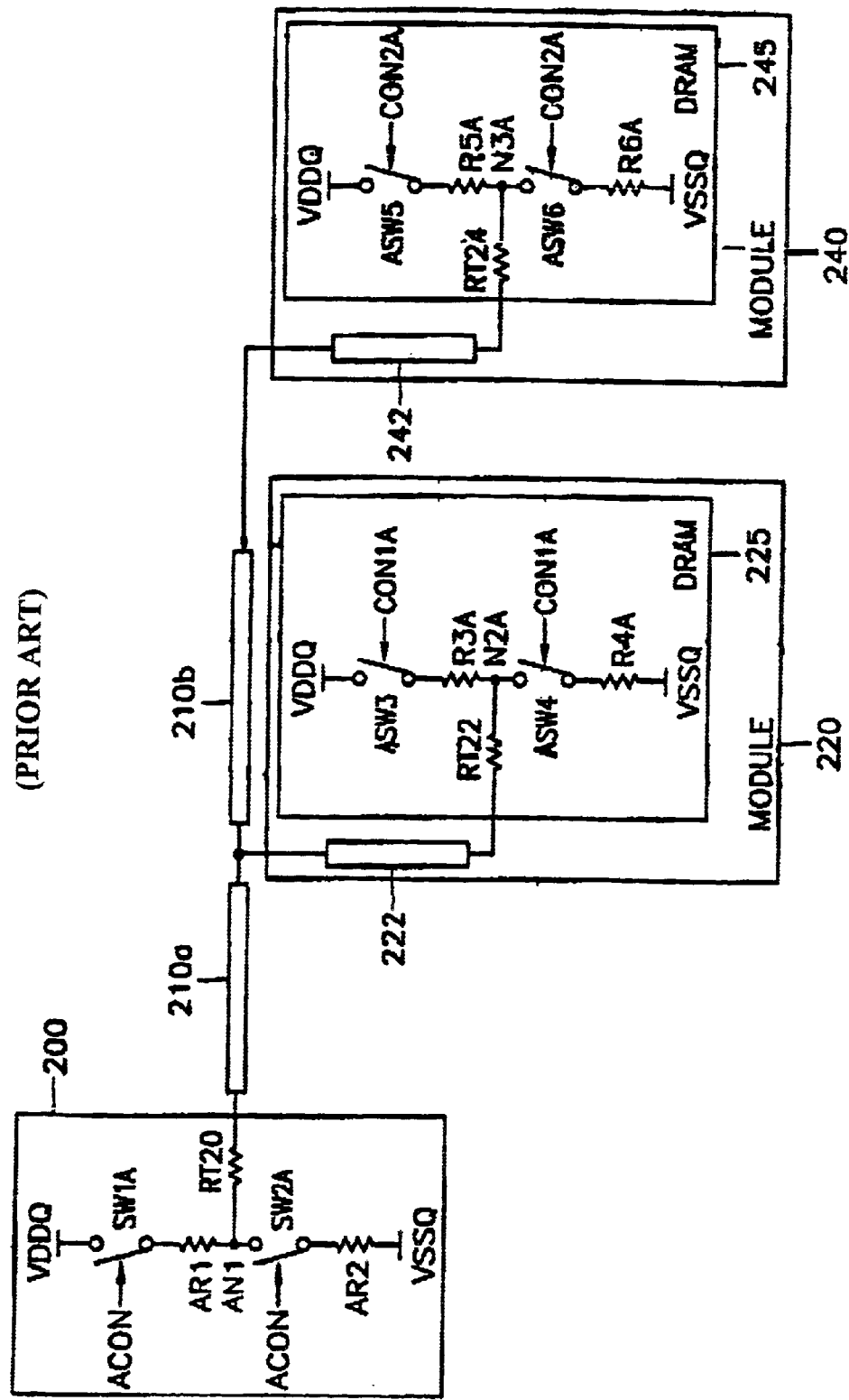
FIG. 2 is a circuit diagram of another conventional semiconductor memory device having a stub bus configuration using active termination.

Referring to FIG. 2, another conventional semiconductor memory system includes a memory controller chip set 200, memory modules 220 and 240, and data buses 210a and 210b.

Referring to FIG. 2, resistors AR1 and AR2 and switches SW1A and SW2A are connected in series between a power voltage VDDQ and a ground voltage VSSQ in the memory controller chip set 200. A termination resistor RT20 is connected between a node AN1 and the data bus 210a. The resistances of the resistors AR1 and AR2 may be the same or different. A first end of the data bus 210a is connected to the termination resistor RT20 and a second end of the data bus 210a is connected to a data input/output bus 222 of the memory module 220 the second end of the data bus 210a is also connected to the data bus 210b.

In the memory module 220, resistors R3A and R4A and switches ASW3 and ASW4 are connected in series between a power voltage VDDQ and a ground voltage VSSQ, and a termination resistor RT22 is connected between a node N2A and the data input/output bus 222. The switches ASW3 and ASW4 are switched on/off according to a control signal CON1A and are controlled such that the termination resistor RT22 is connected to a predetermined voltage when the switches ASW3 and ASW4 are switched on. The predetermined voltage at the node N2A is the voltage divided by the resistors R3A and R4A, and the resistances of the resistors R3A and R4A may be the same or different.

In the memory module 240, resistors R5A and R6A and switches ASW5 and ASW6 are connected in series between a power voltage VDDQ and a ground voltage VSSQ, and a termination resistor RT24 is connected in series between a node N3A and a data input/output bus 242. The switches ASW5 and ASW6 are switched on/off according to a control signal CON2A and are controlled such that the termination resistor RT24 is connected to a predetermined voltage when the switches are switched on. Here, the predetermined voltage is the voltage divided by the resistors R5A and R6A, and the resistances of the resistors R5A and R6A may be the same or different.

FIG. 2 illustrates a memory system including the two memory modules 220 and 240, each of which includes a respective DRAM. However, a memory system may include a plurality of memory modules, and each of the modules may include at least one bank. Here, the bank in a memory module can be referred to as a rank. In addition, active termination can be applied to a command/address bus as well as a data input/output bus. In general, in a case where active termination is applied to a data input/output bus, it may be preferable to turn on the termination resistor of a memory module not to be accessed in terms of the integrity of signals.

As described above, if the control signals CON1A and CON2A are received from the memory controller chip set 200, additional terminals may need to be additionally installed.

FIG. 3 is a table showing an increase in a number of terminals in accordance with active termination in a semiconductor memory system as illustrated, for example, in FIG. 2. Referring to FIG. 3, one terminal may be added to each DRAM, and one terminal may be added to a module connector. In order to separately apply the control signals CON1 and CON2 to the memory modules 220 and 240, respectively, two additional terminals may also be required. Accordingly, memory structures and methods according to embodiments of the present invention may provide memory systems with a configuration resulting in a reduced number of terminals required to control active termination of a data input/output bus.

Figure 4:
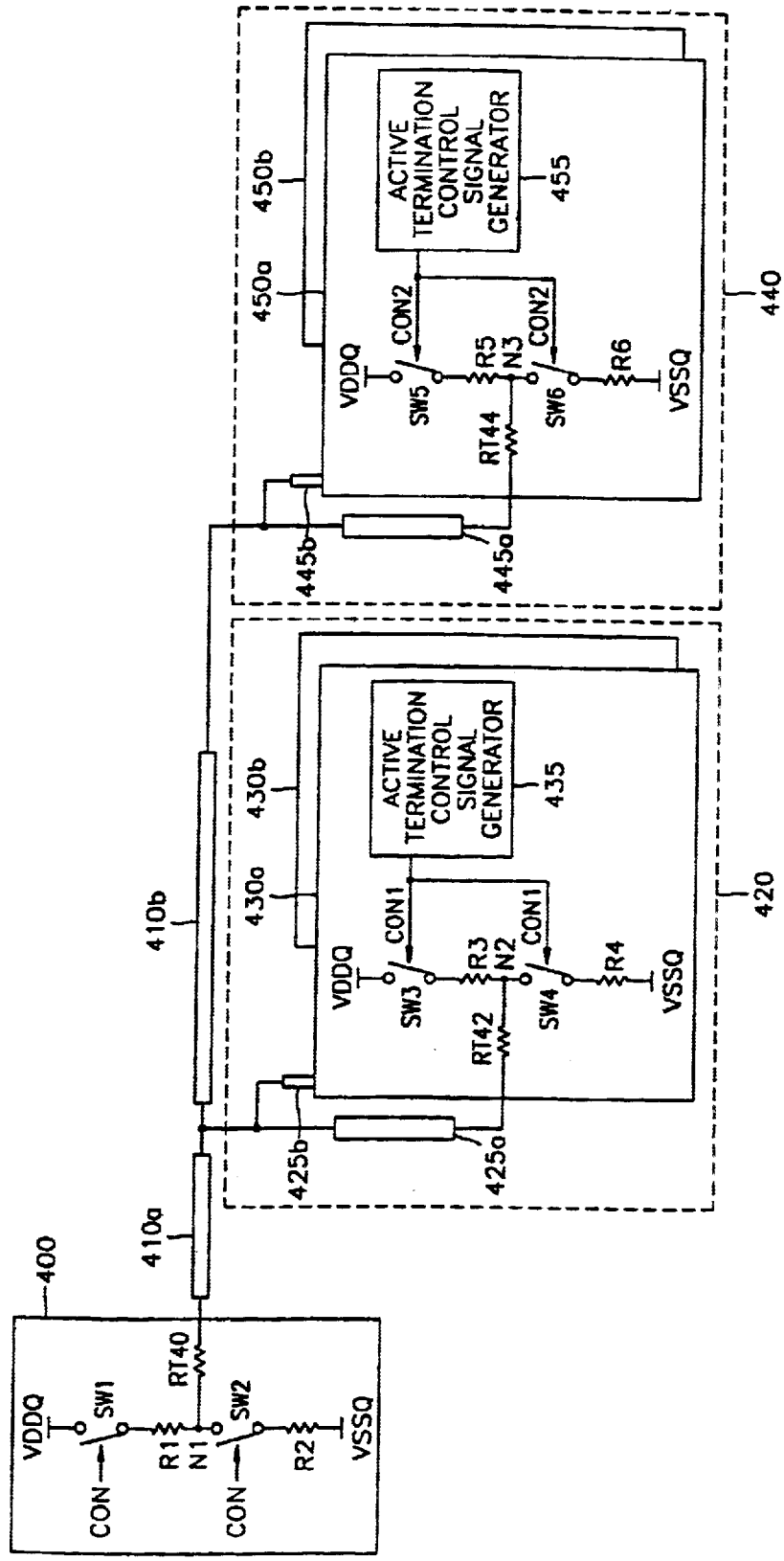
FIG. 4 is a circuit diagram of a semiconductor memory system for controlling active termination according to embodiments of the present invention.

Referring to FIG. 4, a semiconductor memory system according to embodiments of the present invention may include a memory controller chip set 400, data input/output buses 410a and 410b, and memory modules 420 and 440. FIG. 4 illustrates a semiconductor memory system including two memory modules.

In FIG. 4, one memory module is illustrated as including two ranks, but the number of ranks can be changed. One rank may include a plurality of DRAMs. However, for the convenience of explanation, one rank is illustrated as including one DRAM 430a or 450a in FIG. 4.

In the memory controller chip set 400, resistors R1 and R2 and switches SW1 and SW2 are connected in series between a power voltage VDDQ and a ground voltage VSSQ, and a termination resistor RT40 is connected between a node N1 and a data bus 410a. Here, the resistances of the resistors R1 and R2 may be the same or different. A control signal CON for turning on/off an on-chip active termination of the memory controller chip set 400 may be generated in the memory controller chip set 400. In other words, when a DRAM reads data, the switches SW1 and SW2 are turned on by the control signal CON so that the termination resistor RT40 is connected to the node N1. When a DRAM of the first rank 430*a* writes data, the switches SW1 and SW2 are turned off by the control signal so that the termination resistor RT40 is not connected to the node N1.

The memory module 420 is connected to the memory controller chip set 400 via a data input/output bus 410*a* and has a 2-rank structure. In the DRAM 430*a* in a first rank (not shown) installed at the front of a module connector, resistors R3 and R4 and switches SW3 and SW4 are connected in series between a power voltage VDDQ and a ground voltage VSSQ, and a termination resistor RT42 is connected between a node N2 and a data input/output bus 425*a*. Here, the voltage at the node N2 is voltage divided by the resistors R3 and R4, and the resistances of the resistors R3 and R4 may be the same or different. The structure of the DRAM 430*b* in a second rank at the back of the first rank 430*a* is the same as the first rank 430*a*, with the DRAM 430*b* being connected to the input/output bus 430*b* via input/output bus 425*b*. Each of the dynamic random access memories (DRAMs) 430*a–b* and 450*a–b* can be implemented as an integrated circuit device such that all elements of a DRAM are implemented on a single semiconductor substrate. For example, DRAM 430*a* according to embodiments of the present invention can be implemented as an integrated circuit memory device on a single semiconductor substrate including switches SW3 and SW4; resistors RT42, R3, and R4; active termination control signal generator 435; memory cells; and peripheral memory circuitry.

In the memory module 420, the DRAMs 430*a* and 430*b* may each include an active termination control signal generator 435. In other words, the active termination control signal generator 435 generates a control signal CON1 for controlling active termination in response to a chip selection signal separately applied from the controller chip set 400 to the DRAMs 430*a* and 430*b* in the two ranks.

The memory module 440 is connected to the memory controller chip set 400 via data buses 410*a* and 410*b* and has a 2-rank structure. In a DRAM 450*a*, in a first rank installed at the front of the memory module 440, resistors R5 and R6 and switches SW5 and SW6 are connected in series between a power voltage VDDQ and a ground voltage VSSQ, and a termination resistor RT44 is connected between a node N3 and a data input/output bus 445*a*. Here, the voltage at the node N3 is the voltage divided by the resistors R5 and R6, and the resistances of the resistors R5 and R6 may be the same or different. The structure of a DRAM 450*b* in a second rank installed at the rear of the DRAM 450*a* is the same as that of the DRAM 450*a* in the first rank, and the DRAM 450*b* is connected to the data bus 410*b* via the input/output bus 445*b*.

In the memory module, the DRAMs 450*a* and 450*b* each include an active termination control signal generator 455. In other words, the active termination control signal generator 455 generates a control signal CON2 for turning on/off a termination resistor in response to a chip selection signal separately applied from the controller chip set 400 to the two ranks.

In the memory system shown in FIG. 4, if one of ranks is enabled by a data read command signal or data write command signal, the active termination control signal generators 435 and 455, which are installed in the DRAMs 430*a* and 450*b*, respectively, each generate a control signal such that the termination resistor of a memory module including the enabled rank is turned off and generate another control signal such that the termination resistor of a memory module in which a data read or data write operation is not performed is turned on.

As described above, the active termination control signal generators 435 and 455 do not receive control signals for controlling active termination from the memory controller chip set 400 but generate control signals using chip selection signals input into the two ranks belonging to the same module.

Figure 5:
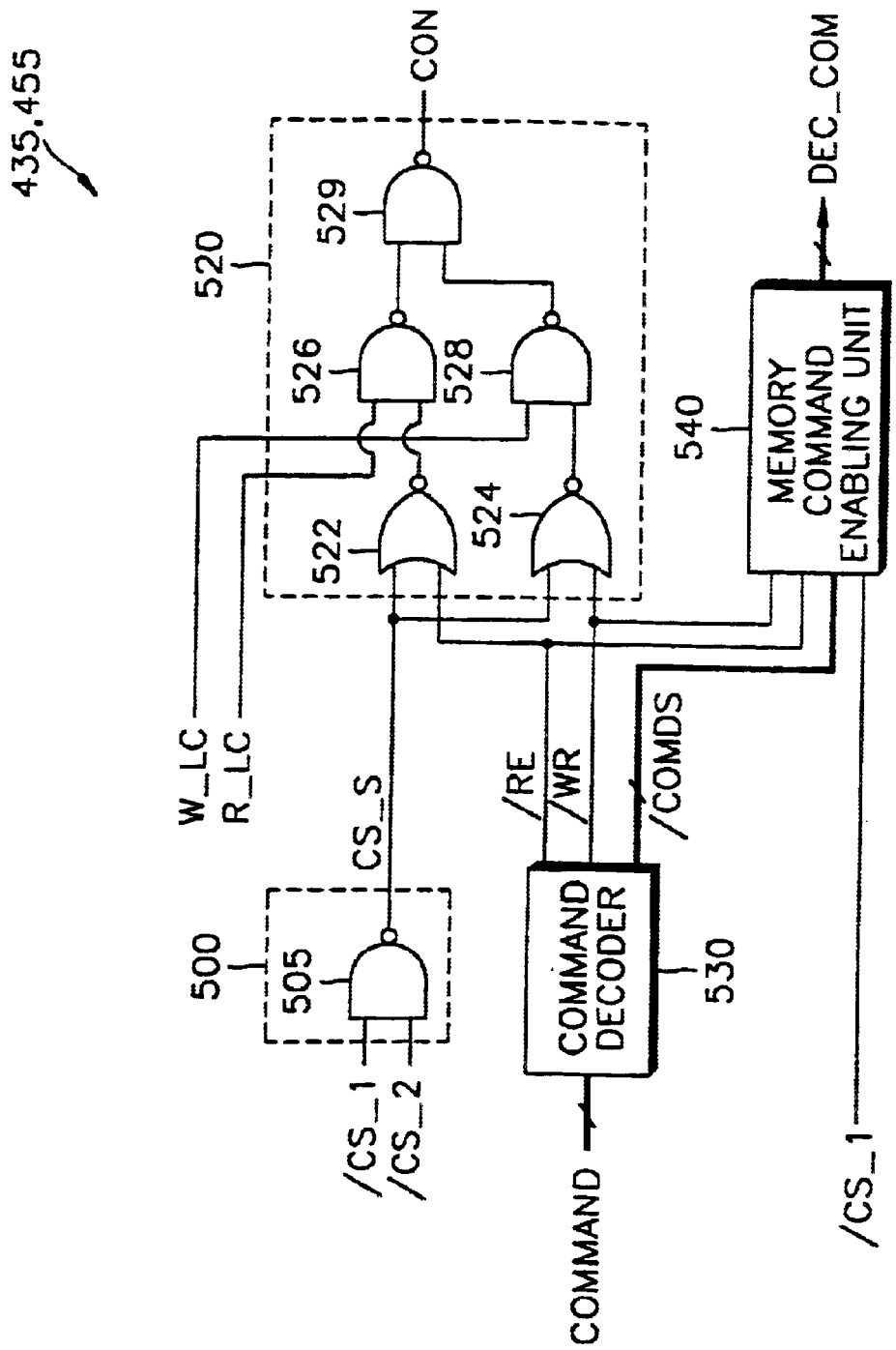
FIG. 5 is a circuit diagram of an active termination control signal generator compatible with the semiconductor memory system of FIG. 4 according to embodiments of the present invention.

Referring to FIG. 5, the active termination control signal generator 435 and 455 each include a chip selection signal input unit 500, a control signal output unit 520, a command decoder 530, and a memory command enabling unit 540. The command decoder 530 and the memory command enabling unit 540 may be installed outside each of the active termination control signal generators 435 and 455 or inside each of the active termination control signal generators 435 and 455.

Referring to FIG. 5, the chip selection signal input unit 500 is comprised of a NAND gate 505 which performs a NAND operation on chip selection signals /CS_1 and /CS_2 and outputs the result as a chip selection signal CS_S. Here, the chip selection signal /CS_1 is for enabling a rank to which, for example, the DRAM 430*a* belongs, among the two ranks in the memory module 420, and the chip selection signal /CS_2 is for enabling the other rank to which, for example, the DRAM 430*b* belongs. Accordingly, if one of the two ranks is selected and begins to operate, one of the chip selection signals /CS_1 and /CS$_{13}$ 2 is enabled to a low level and the output signal CS_S of the NAND gate 505 becomes a high level.

The command decoder 530 decodes a plurality of command signals COMMAND input from the memory controller chip set 400 and outputs the decoded commands. Here, the decoded command signals include a data read command signal /RE, a data write command signal /WR, and another command signal /COMDS.

The control signal output unit 520 performs logical operations on the chip selection signal CS_S, the data read command signal /RE, and the data write command signal /WR output from the command decoder 530, and the result is output as a control signal CON for controlling active termination. For this, the control signal output unit 520 can include NOR gates 522 and 524 and NAND gates 526, 528, and 529.

Operations of the control signal output unit 520 will be described in greater detail. The NOR gate 522 can perform a logical NOR operation on the chip selection signal CS_S and the decoded data read command signal /RE and outputs the result. The NOR gate 524 performs a logical NOR operation on the chip selection signal CS_S and the decoded data write command signal /WR and outputs the result. The NAND gate 526 performs a logical NAND operation on a data read latency control signal R_LC and the output signal of the NOR gate 522 and outputs the result. The NAND gate 528 performs a logical NAND operation on a data write latency control signal W_LC and the output signal of the NAND gate 524 and outputs the result. The NAND gate 529 performs a logical NOR operation on the output signals of the NAND gates 526 and 528 and outputs the result as the control signal CON. Here, if the circuit shown in FIG. 5 is the active termination control signal generator 435, the control signal CON is CON1.

Alternatively, if the circuit shown in FIG. 5 is the active termination control signal 455, the control signal CON is CON2. As described above, the control signal CON is used to control the termination resistor of each DRAM in a memory module to be connected to a predetermined voltage via a predetermined switch. Here, the predetermined voltage represents the voltages at the node N2 or the node N3. The data write and data read latency control signals W_LC and R_LC determine when active termination will be turned on after a predetermined amount of time has passed since the data write command signal /WR and the data read command signal /RE were applied. The data write and data read latency control signals W_LC and R_LC may be determined by a predetermined latency period or a predetermined signal for indicating the time when data is input into/from the memory controller chip set 400.

The memory command enabling unit 540 receives the data read command signal /RE, the data write command signal /WR, or another command signal COMDS decoded in the command decoder 530 and outputs a decoded command signal DEC_COM for enabling the chip selection signal /CS_1 in response to the above command signals. In other words, if one of the two ranks is enabled by the chip selection signal /CS_1 or /CS_2, a DRAM in the enabled rank performs an operation corresponding to the enabled command signal.

Hereinafter, a process of controlling active termination of the semiconductor memory system according to embodiments of the present invention will be described in greater detail with reference to FIGS. 4 and 5. Supposing that the data read command signal /RE is applied to the DRAM 430a in the first rank of the memory module 420, the chip selection signal /CS_1 is enabled to a low level and simultaneously, the output signal of the NAND gate 505 of the chip selection signal input unit 500 becomes a high level. If the command signal decoded in the command decoder is the data read command signal /RE, the output signal of the NOR gate 522 of the control signal output unit 520 becomes a low level. Since the output signals of the NAND gates 526 and 528 become a high level, the control signal CON output via the NAND gate 529 becomes a low level. The switch SW4 of the DRAM 430a shown in FIG. 4 is not turned on, and the termination resistor RT42 is not connected to the ground voltage VSSQ. The DRAM 430a of the first rank performs a read operation following the decoded command signal DEC_COM output from the memory command enabling unit 540. Since the chip selection signals of the memory module 440 are at a high level, the control signal CON2 generated in the active termination control signal generator 455 is output at a high level so that the termination resistor RT44 is connected to the power voltage VDDQ.

On the other hand, in a case where the DRAM 430b in the second rank is enabled by a corresponding command signal, the semiconductor memory system operates in the same manner as the case where the DRAM 430a in the first rank is enabled. If the circuit shown in FIG. 5 is the active termination control signal generator 435 installed in the DRAM 430a shown in FIG. 4, the chip selection signal applied to the DRAM 430a is /CS_1. On the other hand, if the circuit shown in FIG. 5 is the active termination control signal generator 455 installed in the DRAM 430b, the chip selection signal applied to the DRAM 430b is /CS_2.

If both of two ranks are not enabled, the chip selection signals /CS_1 and /CS_2 are set to a high level, and the output signal of the NAND gate 505 of the chip selection signal input unit 500 becomes a low level. If the data read command signal /RE is applied to the memory module 440, the output signal of the NOR gate 522 of the control signal output unit 520 becomes a high level. Accordingly, if the data read latency control signal R_LC is enabled following latency previously set, the output signal of the NAND gate 526 becomes a low level. Thus, the control signal CON output via the NAND gate 529 becomes a high level. At the same time, the switch SW4 of the DRAM 430a is turned on so that the termination resistor RT42 is connected to the ground voltage VSSQ. It is apparent that the termination resistor RT44 in the DRAM 430b is turned on.

As described above, according to embodiments of the present invention, a control signal for controlling active termination is generated with the use of a chip selection signal applied from the memory controller chip set 400. The embodiment of FIG. 5 shows that the chip selection signals /CS_1 and /CS_2, the data read command signal /RE, and the data write command signal /WR are integrated into active termination control signal; however, it is also possible to generate a control signal by integrating only the chip selection signals /CS_1 and /CS_2.

Referring to FIG. 6, in a case where there are two ranks in one memory module 420 or 440, a terminal is added to a DRAM in each of the two ranks so that the DRAM in one of the two ranks can receive a chip selection signal generated from the other rank via the terminal. In addition, since the memory controller chip set 400 does not generate a control signal, the memory controller chip set 400 does not need a terminal. According to embodiments of the present invention, active termination may be performed in every slot of a memory module.

FIG. 7 illustrates a memory system including two memory modules and having a memory configuration in which each of the two memory modules includes two ranks. For example, in a case where the two memory modules each include two ranks, the termination resistor is turned on when a memory controller chip set reads data from a memory module 1. Since the memory module 1 operates, active termination is performed in a memory module 2. Here, since each of the two memory modules includes two ranks, two termination resistors are turned on (2×RT). However, since the memory controller chip set outputs data when performing a data write operation in the memory module 1, active termination is in an off mode. On the other hand, when the memory controller chip set reads data from the memory module 2, active termination may be performed on the memory module 1. In FIG. 7, F_RANK and B_RANK represent a rank located at the front of each of the two memory modules and a rank located at the back of each of the two memory modules, respectively. In other words, operations of memory systems discussed with reference to FIG. 7 may be the same as that of memory systems discussed with reference to FIGS. 4, 5, and 6, except that a number of termination resistors may be varied depending on a number of ranks included in each memory module.

As described above, active termination can be applied to a data input/output bus. In addition, active termination can also be applied to a command/address (C/A) bus. Hereinafter, a semiconductor memory system for controlling active termination of a command/address bus according to embodiments of the present invention will be described in greater detail.

Figure 8:
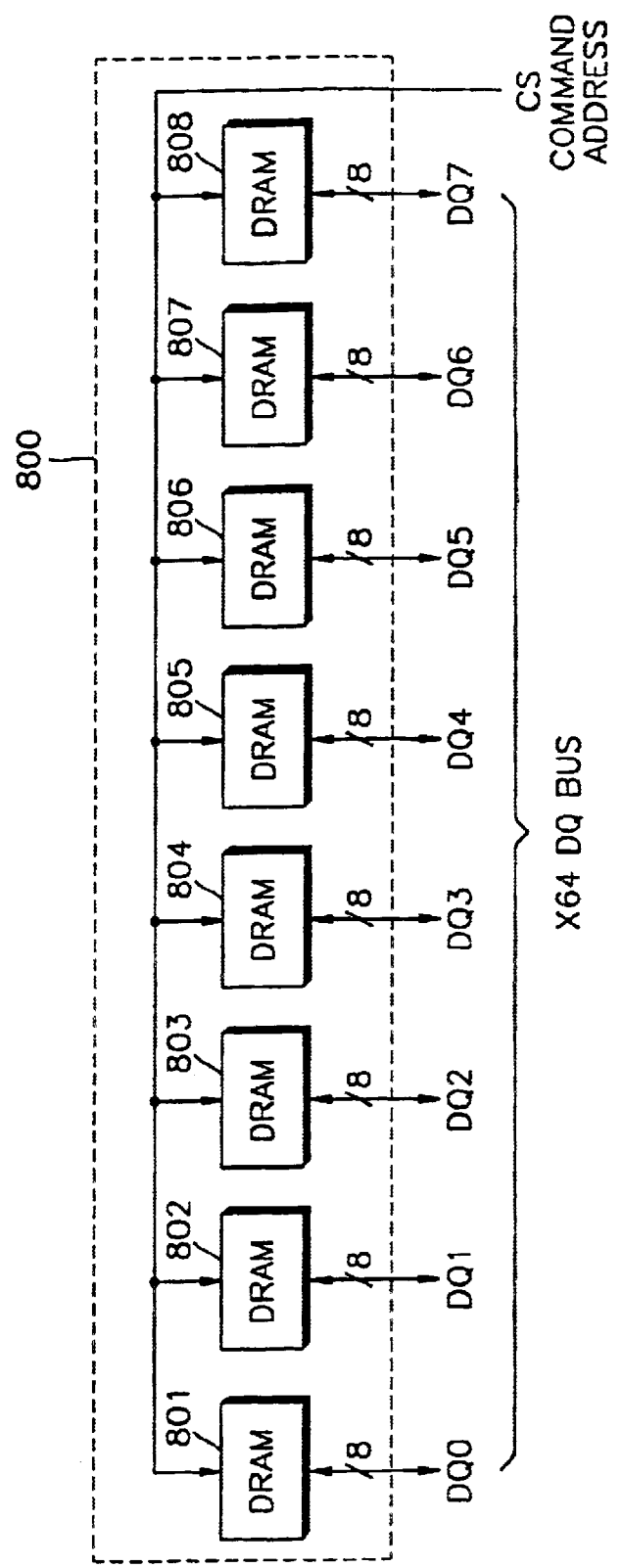
FIG. 8 is circuit diagram of a memory module having a 'one-rank' structure.

Referring to FIG. 8, a memory module having a one-rank structure includes 8 DRAM chips 801 through 808. The DRAM chips 801 through 808 include 8-bit data input/output terminals DQ0 through DQ7, respectively. Accordingly, one rank is connected to a ×64 data input/ output bus. Each of the DRAM chips 801 through 808 shares a chip selection signal input terminal, a command signal input terminal, and an address signal input terminal ADDRESS. When an address signal ADDRESS, a command signal COMMAND, or a chip selection signal CS is applied from a memory controller chip set, termination resistors must be connected to one another. A relatively simple way to connect all the termination resistors is at the command/address signal input unit of each DRAM. However, in a case where only one rank exists in a memory module, 8 termination resistors in each DRAM can be connected to be simultaneously turned on. On the other hand, in a case where two ranks exist in a memory module, 16 termination resistors may be turned on. In other words, the number of termination resistors to be turned on in a memory module including one rank may be different than a number of termination resistors which is to be turned on in a memory module including two ranks. In addition, in order to improve integration of signals at a command/address bus, it may be preferable that the termination resistor of the command/address bus is connected to only DRAMs which are a relatively long distance away from a command/address signal input unit.

Figure 9A:
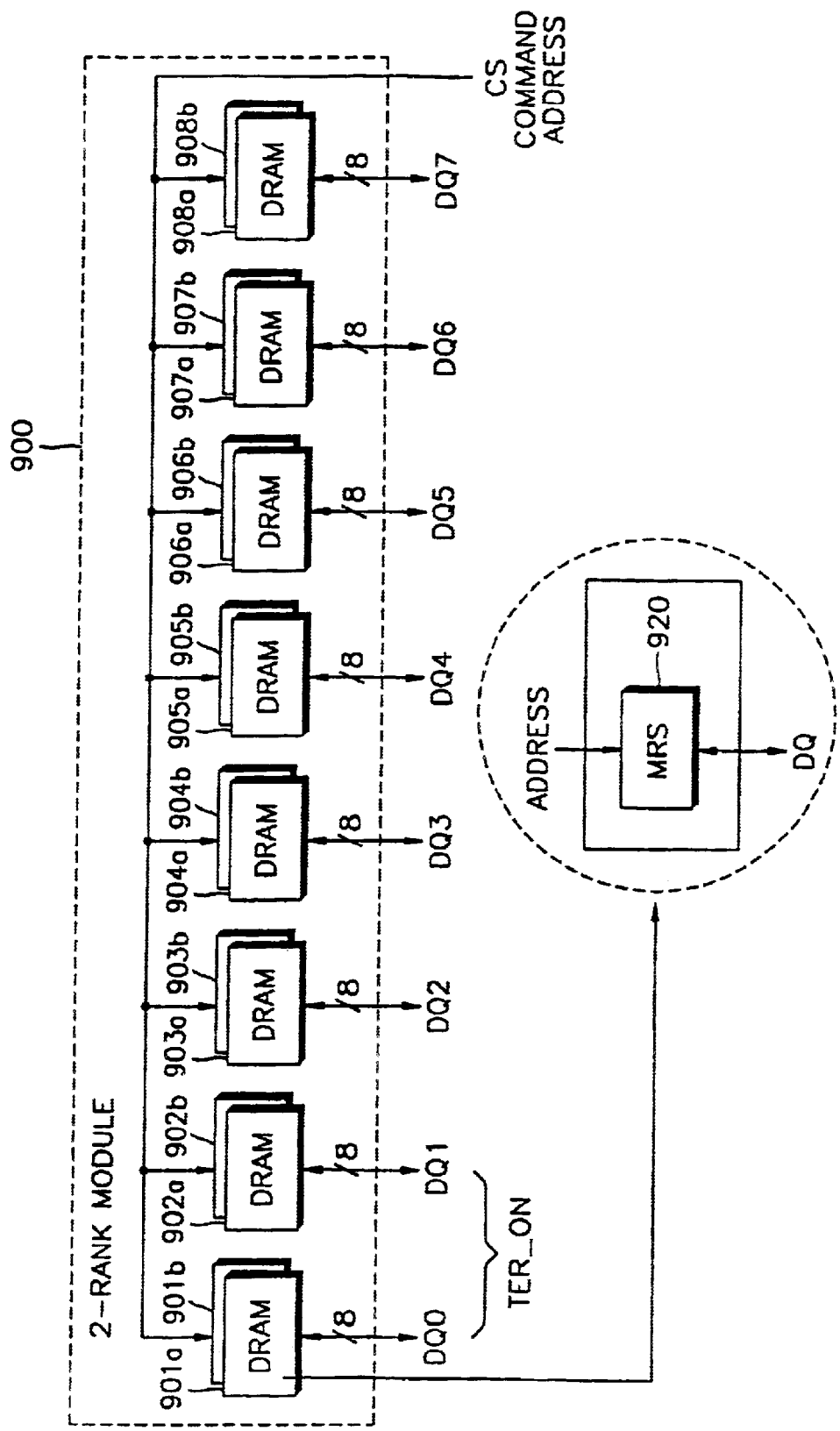
FIGS. 9A and 9B are circuit diagrams showing active termination control of a command/address bus through mode resister setting with the use of a data input/output bus according to embodiments of the present invention.
Figure 9B:
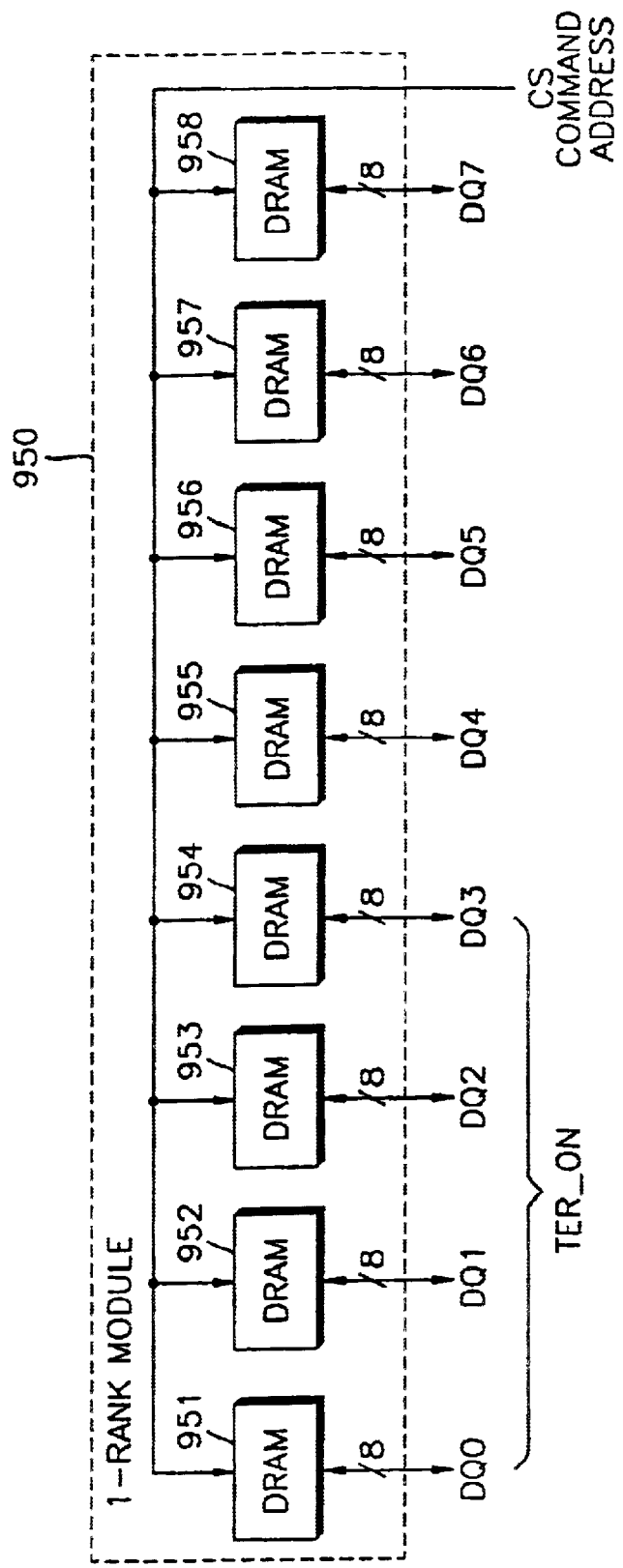

FIGS. 9A and 9B are diagrams illustrating systems and methods for controlling active termination by setting a mode register using a data input/output bus according to embodiments of the present invention. Specifically, FIG. 9A illustrates a memory module having a two-rank structure, and FIG. 9B illustrates a memory module having a one-rank structure.

Referring to FIG. 9A, DRAMs can be installed at the front and back of a memory module 900 having a 2-rank structure. Specifically, DRAMs 901a through 908a can be installed at the front of the memory module 900, and DRAMs 901b through 908b can be installed at the back of the memory module 900. Each of the DRAMs 901a through 908a and 901b through 908b receives a chip selection signal CS, a command signal COMMAND, and an address signal ADDRESS via a chip selection signal terminal, a command signal input terminal, and an address signal input terminal, respectively.

Referring to FIG. 9B, a memory module 950 having a 1-rank structure includes 8-bit DRAMs 951 through 958. According to embodiments of the present invention, a data input/output bus can be used along with an address bus during mode register setting (MRS), and thus it is possible to separately control termination of DRAMs. A mode register may generally be used to set an operational mode or parameter values in a memory system. In most cases, an address bus may be used in setting the mode register; however, since the address bus is equally applied to DRAMs, it may be difficult to separately control termination of DRAMs.

Referring to FIGS. 9A and 9B, active termination of DRAMs can be separately controlled through setting the mode register using a data input/output bus so that a number of termination resistors to be turned on in a memory system having a two-rank structure is the same as a number of termination resistors to be turned on in a memory system having a one-rank structure. In FIG. 9A, termination resistors at command/address signal input units DQ0 and DQ1 connected to two DRAMs 901a and 901b or 902a and 902b in each of the two ranks are turned on. In addition, in FIG. 9B, termination resistors at command/address signal input units DQ0 through DQ3 connected to four DRAMs 951 through 954 in one rank are turned on.

According to embodiments of the present invention discussed above, active termination of DRAMs can be controlled such that termination resistor values can be set to be the same irrespective of the configuration of ranks. An example of a configuration of a mode register setting 920 will be described with reference to FIG. 10.

Figure 10:
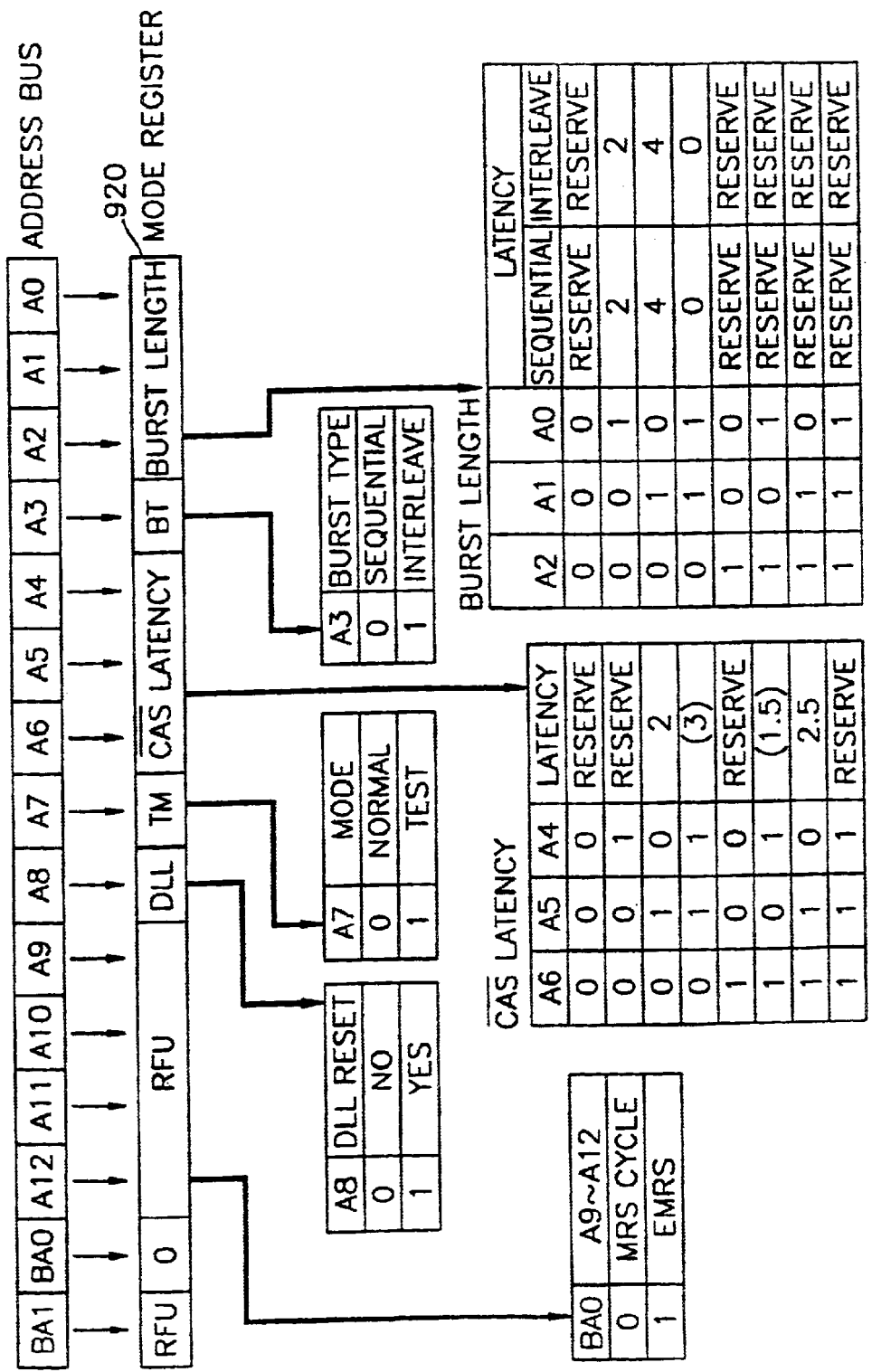
FIG. 10 is a diagram illustrating mode resister settings with the use of an address bus.

Referring to FIG. 10, an address bus ADDRESS BUS can include 13 address bits A0 through A12 and bank selection address bits BA0 and BA1. In other words, the bank selection address bits BA0 and BA1 can be used to select a plurality of banks (ranks) through bit combination. For an actual mode register setting, address bits A0 through A2 among the 13 address bits A0 through A12 can be used to represent burst length. Latency corresponds to a sequential manner or an interleaved manner. In addition, latency can be set as 2, 4, or 8 through bit combination using the address bits A0 through A2. Address bit A3 can be used to determine a burst type (BT) in mode register setting (MRS). When the address bit A3 is 0, the burst type is determined as a sequential type. On the other hand, when the address bit A3 is 1, the burst type can be determined as an interleaved type.

Address bits A4 through A6 can be used to represent column address strobe (CAS) latency and may be set at 2, 3, 1.5, or 2.5 through bit combination. Address bit A7 can be used to determine whether an operational mode is a test mode or a normal mode. When the address bit A7 is 0, the operational mode can be determined as a normal mode. On the other hand, when the address bit A7 is 1, the operational mode can be determined as a test mode. Address bit A8 can be used to determine whether or not a delay locked loop (DLL) is reset. When the address bit A8 is 1, the address bit A8 can represent a state where a DLL is reset. Address bits A9 through A12 can be bits reserved for future use (RFU). When a bank selection address BA0 is 0, it can represent a mode register setting (MRS) cycle. On the other hand, when the bank selection address BA0 is 1, it represents an extended mode register setting (EMRS) cycle. As described above, an address bus is commonly applied to a plurality of ranks existing in one memory module. Thus, in order to independently control each of the DRAMs, a data input/output terminal or a data input/output bus connected to each of the DRAMs can be used.

Figure 11A:
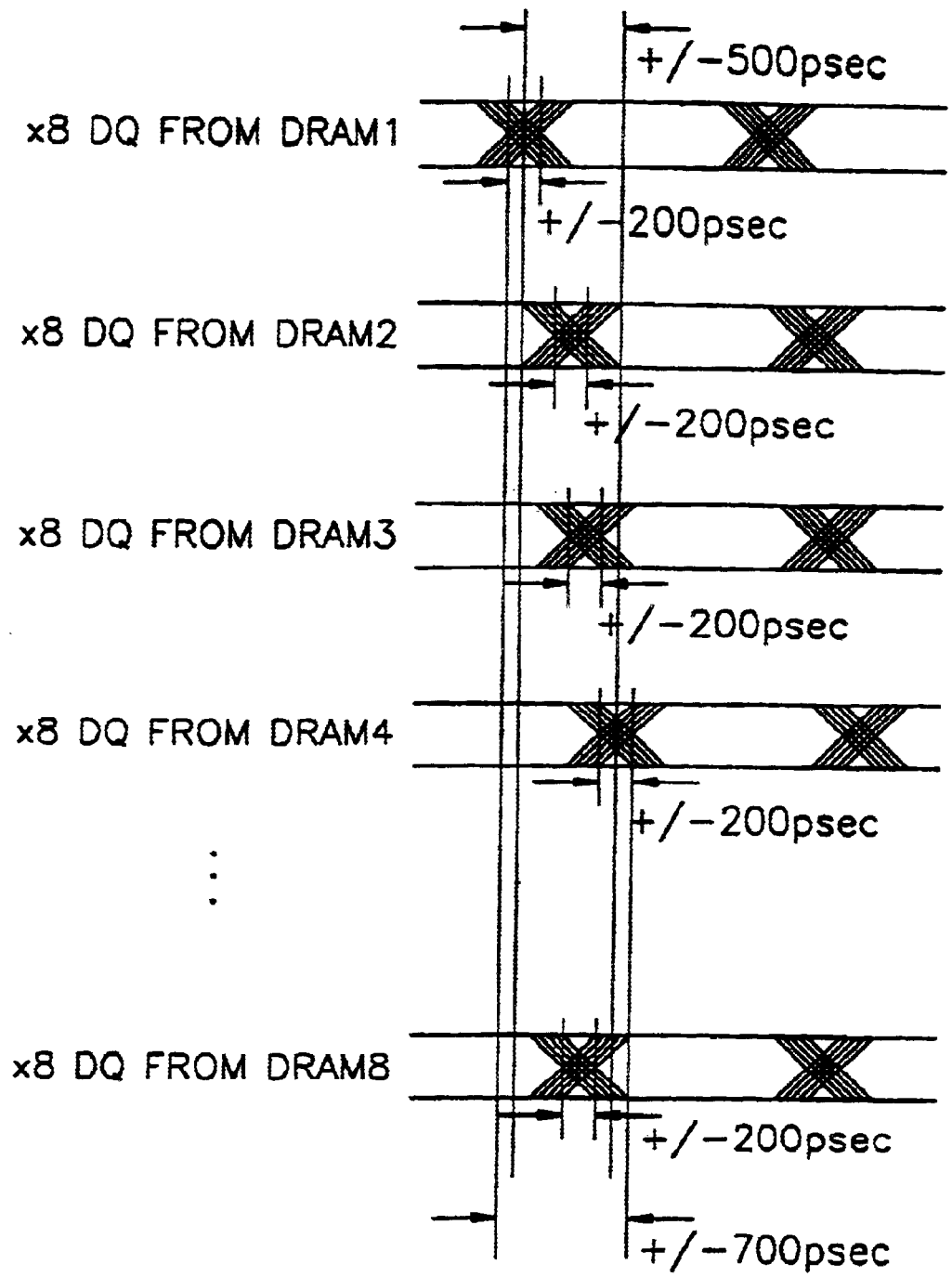
FIGS. 11A and 11B are diagrams illustrating results of setting a mid-timing value through mode resister settings with the use of a data input/output bus according to embodiments of the present invention when reading data.
Figure 11B:
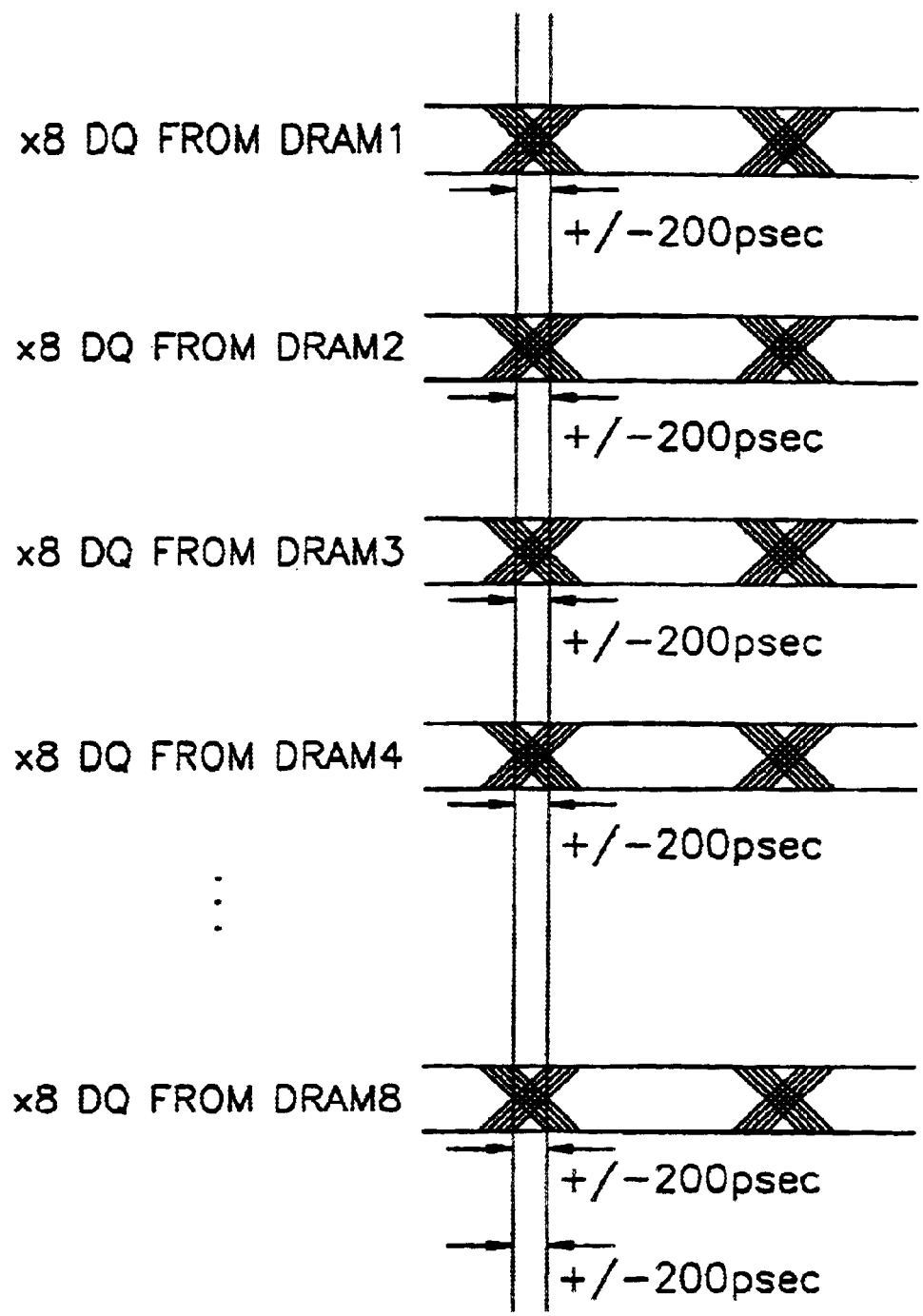

FIGS. 11A and 11B are diagrams illustrating results of setting a mid value of the time taken to access each data input/output terminal of DRAMs through mode resister setting with the use of a data input/output bus according to embodiments of the present invention when reading data. Specifically, FIG. 11A illustrates a case in which mid values of the time taken to access each data input/output terminal during a data read operation of DRAMs are not the same. FIG. 11B illustrates results of setting mid values of the time taken to access each data input/output terminal to be the same through setting the mode register with the use of data input/output terminals according to embodiments of the present invention.

In most cases, mid values of the time taken to access 8 data input/output terminals (that is, ×64) of 8 DRAMs may be different from one another when reading data, in which case a valid data window may decrease. Specifically, referring to FIG. 11A, an average access time of data input/output terminals when DRAMs read data is ±200 psec; however, since mid values of the access times of data input/output terminals may not be the same, there may be a difference of ±200 psec between the maximum access time and the minimum access time, and accordingly, a valid data window may be reduced by as much as ±700 psec.

According to embodiments of the present invention, it is possible to set mid values of the access times of data input/output terminals to be the same by independently controlling a delay time of each DRAM reading data.

Referring to FIG. 11B, an appropriate amount of delay time can be set by the mode register of each DRAM by monitoring data input/output timing when the DRAMs read data, and thus the mid values of the access time of data input/output terminals of the DRAMs can be the same. If an individual value, as described above, is set by the mode register of each of the DRAMs, a valid data window can be reduced by as much as ±200 psec such that an offset, which occurs between the data input/output terminals of the DRAMs when the DRAMs read data, can be reduced.

According to some embodiments of the present invention, it is possible to reduce a number of terminals required to control active termination of a data input/output bus in a memory system including a plurality of memory modules. In addition, it is possible to separately control active termination through setting the mode register with the use of an address terminal and a data input/output terminal.

According to some embodiments of the present invention, semiconductor memory systems can be provided that control active termination and that are capable of generating a control signal for controlling turning on/off termination resistors of a data input/output terminal while reducing an increase in a number of terminals.

According to some additional embodiments of the present invention, semiconductor memory systems can be provided that are capable of separately controlling active termination in a memory module by setting a mode register with the use of a data input/output bus.

According to yet additional embodiments of the present invention, methods can be provided for controlling active termination which are capable of generating a control signal for controlling turning on/off termination resistors of a data input/output terminal while reducing an increase in a number of terminals.

According to some embodiments of the present invention, a semiconductor memory system receives a predetermined command/address signal from a memory controller chip set and reads and writes data in response to the command/address signal. The semiconductor memory system can include a memory module with at least one rank (a bank in a module) having a plurality of memory chips. The plurality of chips can include a plurality of data input/output terminals which input/output predetermined data from the memory controller chip set via a data input/output bus; a plurality of termination resistors connected to the data input/output terminals; an active termination control signal generator which generates a control signal for controlling active termination of the data input/output terminals in response to a chip selection signal input from the memory controller chip set; and a plurality of switches which are switched on/off in response to the control signal and which switch the termination resistors while they are switched on such that the termination resistors are connected to a predetermined voltage.

According to additional embodiments of the present invention, a semiconductor memory system can receive a predetermined command/address signal from a memory controller chip set and can read and write data in response to the predetermined command/address signal. The semiconductor memory system can include at least one memory module with at least one rank (bank in the memory module) having a plurality of memory chips. The plurality of memory chips can each include an address signal input terminal for receiving an address signal from the memory controller chip set, a data input/output terminal for inputting/outputting predetermined data from the memory controller chip set via a data input/output bus, and termination resistors which are controlled by the data input/output bus according to the number of ranks in the memory module.

According to yet additional embodiments of the present invention, a method can be provided for controlling active termination of a data bus of a memory system including a controller chip set for generating a predetermined command/address signal and a plurality of memory modules each writing data or reading data in response to the predetermined command/address signal and having at least one rank. The method can includes: generating a chip selection signal which selects and enables one of the ranks of the plurality of memory modules; generating a control signal for controlling active termination in response to the chip selection signal; and turning on/off a predetermined termination resistor in response to the control signal.

According to some embodiments of the present invention it is possible to reduce a number of terminals required to control active termination of a data input/output bus in a memory system having a plurality of memory modules. In addition, it is possible to separately control active termination through setting the mode register with the use of an address terminal and a data input/output terminal. It is also possible to reduce the number of module pins and controller pins by reducing a number of terminals required for controlling active termination of a data input/output bus in a memory system including a plurality of memory modules.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device for use in a memory system that receives predetermined command/address signals from a memory controller and that reads and writes data in response to the command/address signals, the memory device comprising:
   at least one input/output terminal that inputs/outputs data from/to the memory controller via a data input/output bus;
   at least one termination resistor;
   an active termination control signal generator that generates a control signal to control active termination of the at least one data input/output terminal in response to a chip selection signal from the memory controller; and
   at least one switch coupled in series with the at least one termination resistor between the at least one input/output terminal and a predetermined voltage wherein the at least one switch is switched on/off in response to the control signal such that the at least one input/output terminal is connected/disconnected to/from the predetermined voltage responsive to the control signal and such that the at least one termination resistor is coupled in series between the predetermined voltage and the at least one input/output terminal when the at least one switch is switched on and such that the at least one input/output terminal is decoupled from the predetermined voltage when the at least one switch is switched off.

2. An integrated circuit memory device according to claim 1 wherein the active termination control signal generator performs a logic operation on a first chip selection signal for a first rank of memory devices including the integrated circuit memory device and on a second chip selection signal for a second rank of memory devices not including the integrated circuit memory device and wherein the active termination control signal generator generates the control signal based on the logic operation.

3. An integrated circuit memory device according to claim 2 wherein the active termination control signal generator comprises:

a chip selection signal input unit which performs a logic NAND operation on the first and second chip selection signals and outputs the result as a third chip selection signal;

a command decoder that decodes a plurality of command signals applied via a command/address bus and generates a data read command signal and a data write command signal based on the decoded command signals; and a control signal output unit that performs logic operations on the third chip selection signal, the data read command signal, the data write command signal, and a data read/write latency control signal and generates the control signal based on the result of the logic operations.

4. An integrated circuit memory device according to claim 3 wherein the control signal output unit comprises:

a first logic NOR operator that performs a logic NOR operation on the third chip selection signal and the data read command signal;

a second logic NOR operator that performs a logic NOR operation on the third chip selection signal and the data write command signal;

a first logic NAND operator that performs a logic NAND operation on the data read latency control signal and the output signal of the first logic NOR operator;

a second logic NAND operator which performs a logic NAND operation on the data write latency control signal and the output signal of the second logic NOR operator; and a third logic NAND operator that performs a logic NAND operation on the output signals of the first and second logic NAND operators and outputs the result as the control signal.

5. An integrated circuit memory device according to claim 1 further comprising:

a first chip selection terminal configured to receive a first chip selection signal for a first rank to which the memory device belongs wherein the first chip selection terminal is coupled to the active termination control signal generator and wherein the first chip selection signal is received from the memory controller; and a second chip selection terminal configured to receive a second chip selection signal for a second rank to which the memory device does not belong wherein the second chip selection terminal is coupled to the active termination signal generator, wherein the second chip selection signal is received form the memory controller, and wherein the active termination control signal generator generates the control signal for controlling active termination in response to the first and second chip selection signals.

6. The integrated circuit memory device according to claim 1 wherein the active termination control signal generator controls the at least one switch to turn off when one of the data write command and the data read command signal is enabled for the memory device.

7. An integrated circuit memory device according to claim 1 wherein the memory controller comprises a memory controller chip set that is distinct from the integrated circuit memory device.

8. A method of operating an integrated circuit memory device for use in a memory system that receives predetermined command/address signals from a memory controller and that reads and writes data in response to the command/address signals wherein the integrated circuit memory device comprises at least one input/output terminal that inputs/outputs date from/to the memory controller via a data input/output bus and at least one termination resistor, the method comprising:

generating a control signal to control active termination of the at least one data input/output terminals in response to a chip selection signal from the memory controller; and responsive to the control signal, coupling the at least one termination resistor in series between a predetermined voltage and the at least one input/output terminal and decoupling the at least one termination resistor from between the predetermined voltage and the at least one input/output terminal.

9. A method according to claim 8 wherein the memory device comprises at least one switch in series with the at least one input/output terminal, the at least one termination resistor, and the predetermined voltage wherein coupling the at least one termination resistor in series between the predetermined voltage and the at least one input/output terminal comprises turning the switch on responsive to the control signal and wherein decoupling the at least one termination resistor from between the predetermined voltage and the at least one input/output terminal comprises turning the switch off responsive to the control signal.

10. A method according to claim 8 wherein generating the control signal comprises performing a logic operation on a first chip selection signal for a first rank of memory devices including the integrated circuit memory device and on a second chip selection signal for a second rank of memory devices not including the integrated circuit memory device and generating the control signal based on the logic operation.

11. A method according to claim 10 wherein performing the logic operation comprises:

performing a logic NAND operation on the first and second chip selection signals and outputs the result as a third chip selection signal;

decoding a plurality of command signals applied via a command/address bus generates a data read command signal and a data write command signal based on the decoded command signals; and performing logic operations on the third chip selection signal, the data read command signal, the data write command signal, and a data read/write latency control signal; and generating the control signal based on the result of the logic operations.

12. A method according to claim 1 wherein performing logic operations comprises:

performing a logic NOR operation on the third chip selection signal and the data read command signal;

performs a logic NOR operation on the third chip selection signal and the data write command signal;

performing a logic NAND operation on the data read latency control signal and the output signal of the first logic NOR operator;

performing a logic NAND operation on the data write latency control signal and the output signal of the second logic NOR operator; and performing a logic NAND operation on the output signals of the first and second logic NAND operators and outputs the result as the control signal.

13. A method according to claim 8 further comprising:

receiving a first chip selection signal for a first rank to which the memory device belongs wherein the first chip selection signal is received from the memory controller; and receive a second chip selection signal for a second rank to which the memory device does not belong, wherein the second chip selection signal is received from the memory controller, and wherein the control signal for controlling active termination is generated responsive to both the first and second chip selection signals.

14. A method according to claim 8 wherein the at least one termination resistor is decoupled from between the predetermined voltage and the at least one input/output terminal when one of the data write command and the data read command signal is enabled for the memory device.

15. A method according to claim 8 wherein the memory controller comprises a memory controller chip set that is distinct from the integrated circuit memory device.

16. A semiconductor memory system, which receives a predetermined command/address signal from a memory controller chip set and reads and writes data in response to the command/address signal, the semiconductor memory system comprising a memory module, which comprises at least one rank (a bank in a module) including a plurality of memory chips, wherein the plurality of chips comprises:

a plurality of data input/output terminals which input/output predetermined data from the memory controller chip set via a data input/output bus;

a plurality of termination resistors connected to the data input/output terminals;

an active termination control signal generator which generates a control signal for controlling active termination of the data input/output terminals in response to a chip selection signal input from the memory controller chip set; and a plurality of switches which are switched on/off in response to the control signal and switch the termination resistors while they are switched on such that the termination resistors are connected to a predetermined voltage.

17. The semiconductor memory system of claim 16, wherein the active termination control signal generator performs a logic operation on a first chip selection signal applied to one rank and a second chip selection signal applied to other ranks and generates the control signal in response to the result of the logic operation.

18. The semiconductor memory system of claim 17, wherein the active termination control signal generator comprises:

a chip selection signal input unit which performs a logic NAND operation on the first and second chip selection signals and outputs the result as a third chip selection signal;

a command decoder which decodes a plurality of command signals applied via a command/address bus and generates a data read command signal and a data write command signal based on the decoded command signals; and a control signal output unit which performs logic operations on the third chip selection signal, the data read command signal, the data write command signal, and a data read/write latency control signal and generates the control signal based on the result of the logic operations.

19. The semiconductor memory system of claim 18, wherein the control signal output unit comprises:

a first logic NOR means which performs a logic NOR operation on the third chip selection signal and the data read command signal;

a second logic NOR means which performs a logic NOR operation on the third chip selection signal and the data write command signal;

a first logic NAND means which performs a logic NAND operation on the data read latency control signal and the output signal of the first logic NOR means;

a second logic NAND means which performs a logic NAND operation on the data write latency control signal and the output signal of the second logic NOR means; and a third logic NAND means which performs a logic NAND operation on the output signals of the first and second logic NAND means and outputs the result as the control signal.

20. The semiconductor memory system of claim 16, wherein the at least one memory chip comprises a rank to which the at least one memory chip belongs and a terminal for receiving a chip selection signal applied to another rank to which the at least one memory chip does not belong.

21. The semiconductor memory system of claim 16, wherein the active termination control signal generator controls the switch to be turned off when one of the data write command signal and the data read command signal is enabled in the at least one memory chip.

22. A semiconductor memory system which receives a predetermined command/address signal from a memory controller chip set and reads and writes data in response to the predetermined command/address signal, the semiconductor memory system comprising at least one memory module which comprises at least one rank (bank in the memory module) including a plurality of memory chips, wherein the plurality of memory chips each comprise:

an address signal input terminal for receiving an address signal from the memory controller chip set;

a data input/output terminal for inputting/outputting predetermined data from the memory controller chip set via a data input/output bus; and termination resistors which are controlled by the data input/output bus according to the number of ranks in the memory module.

23. The semiconductor memory system of claim 22, wherein in the plurality of memory chips, the number of termination resistors to be turned on is controlled by setting a mode register which is controlled by the data input/output bus.

24. The semiconductor memory system of claim 23, wherein the semiconductor memory system separately controls turning on/off of the termination resistors of the memory chips with the use of both an address signal input terminal and the data input/output terminal during setting the mode register.

25. A memory system, which commonly receives a predetermined command/address signal from a memory controller chip set, reads or writes data through data input/output buses, the memory system using the data input/output buses when mode resister setting for controlling a termination resistor of the predetermined command/address signal.

26. A method for controlling active termination of a data bus of a memory system which comprises a controller chip set for generating a predetermined command/address signal and a plurality of memory modules each writing data or reading data in response to the predetermined command/address signal and having at least one rank, the method comprising:

(a) generating a chip selection signal which selects and enables one of the ranks of the plurality of memory modules;

(b) generating a control signal for controlling active termination in response to the chip selection signal; and (c) turning on/off a predetermined termination resistor in response to the control signal.

27. The method of claim 26, wherein the control signal controls the predetermined termination resistor to be turned off when a data write command signal or a data read command signal is enabled in the rank selected by the chip selection signal.

28. The method of claim 26, wherein the step (b) comprises:

(b1) outputting a third chip selection signal in response to a first chip selection signal applied to one of the ranks of the plurality of memory modules and a second chip selection signal applied to other ranks of the plurality of memory modules;

(b2) decoding a plurality of command signals generated from the memory controller chip set and generating a data write command signal and a data read command signal based on the results of decoding the plurality of command signals; and (b3) logically combining the third chip selection signal, the data read or data write command signal, and the data read or data write latency control signal and generating the control signal based on the result of the logic operations.

* * * * *